United States Patent
Smith et al.

(10) Patent No.: US 7,058,914 B2
(45) Date of Patent: Jun. 6, 2006

(54) AUTOMATIC LATCH COMPRESSION/REDUCTION

(75) Inventors: Jack R Smith, South Burlington, VT (US); Sebastian T Ventrone, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 350 days.

(21) Appl. No.: 10/604,279

(22) Filed: Jul. 8, 2003

(65) Prior Publication Data

US 2005/0010888 A1 Jan. 13, 2005

(51) Int. Cl.
*G06F 9/45* (2006.01)

(52) U.S. Cl. .............................. 716/10; 716/6

(58) Field of Classification Search ................. 716/10, 716/6
See application file for complete search history.

(56) References Cited

U.S. PATENT DOCUMENTS

| | | | | |
|---|---|---|---|---|
| 5,515,526 A | * | 5/1996 | Okuno | 716/2 |
| 5,822,217 A | * | 10/1998 | Shenoy | 716/6 |
| 6,023,568 A | * | 2/2000 | Segal | 716/6 |
| 2003/0126579 A1 | * | 7/2003 | Whitaker et al. | 716/18 |
| 2003/0182638 A1 | * | 9/2003 | Gupta et al. | 716/4 |
| 2004/0261043 A1 | * | 12/2004 | Baumgartner et al. | 716/4 |

FOREIGN PATENT DOCUMENTS

JP 2002093188 A 3/2003

* cited by examiner

*Primary Examiner*—Vuthe Siek
*Assistant Examiner*—Tuyen To
(74) *Attorney, Agent, or Firm*—Gibb I.P. Law Firm, LLC; Richard A. Henkler, Esq.

(57) ABSTRACT

The disclosure presents a method of designing an integrated circuit having latches. The invention first prepares a logical design of logic devices and latches and then creates a physical design by positioning the logic devices and the latches within the integrated circuit based on the logical design. During the process of creating the physical design the invention eliminates redundant latches by combining latches which do not transition during the same clock cycle, latches which do not relate to the same logical function, latches which are in the same clock domain, and latches that are within a given physical proximity of each other.

40 Claims, 3 Drawing Sheets

AUTOMATIC LATCH COMPRESSION/REDUCTION

BACKGROUND OF INVENTION

1. Field of the Invention

The present invention generally relates to a method of designing an integrated circuit having latches and more particularly to a method which eliminates redundant latches by combining latches.

2. Description of the Related Art

Current designs consume a significant portion of their total power in the latches and clock tree. Designers require latches to hold the state of the design from cycle to cycle. While some clock gating has been added to the architecture, the sheer number of latches impact the area and the overall clock tree design. On the other hand, the actual use of particular latches on a cycle by cycle basis is often sparse. In addition, whole cores of latches may be non-overlapping in a time domain. Unfortunately, designers are unable to effectively determine which latches are non-overlapping, especially, when often the overlapping latches are from diverse areas of the design and the designer may be unable to understand the uses of another designer's latch implementation.

SUMMARY OF INVENTION

The following disclosure presents a method of designing an integrated circuit having latches. The invention first prepares a logical design of logic devices and latches and then creates a physical design by positioning the logic devices and the latches within the integrated circuit based on the logical design. During the process of creating the physical design, the invention eliminates redundant latches by combining latches which do not transition during the same clock cycle, do not relate to the same logical function, are in the same clock domain, and are within a given physical proximity of each other.

The invention determines whether latches transition during the same clock cycle by running a simulation of an initial physical design and recording the latches that transition during each clock cycle. The invention also determines whether an adequate timing slack exists between transitions of latches that do not transition during the same clock cycle.

The foregoing process of eliminating redundant latches comprises replacing at least two latches with a single latch. The process of eliminating redundant latches produces a revised physical design, and the invention tests the revised physical design to determine whether the revised physical design performs as expected. The invention determines whether the latches relate to the same logical function by recording which latches are associated with each logical function in the logical design and determines whether the latches are in the same clock domain by recording which latches are associated with each clock domain in the logical design.

BRIEF DESCRIPTION OF DRAWINGS

The foregoing invention will be better understood from the following detailed description of preferred embodiments with reference to the drawings, in which.

DETAILED DESCRIPTION

Figure 1A:
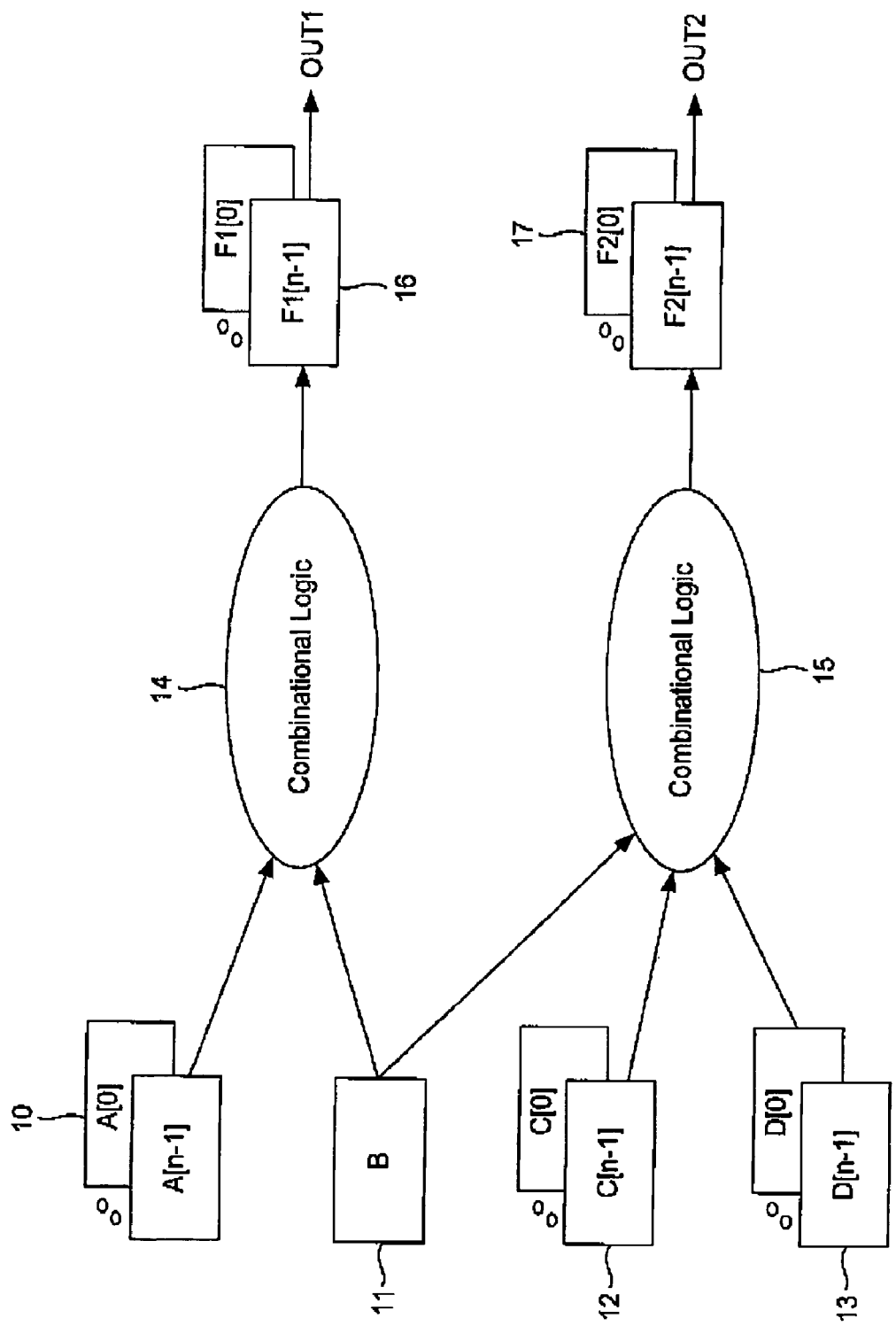
FIG. 1A is a schematic diagram of a initial physical design before elimination of redundant latches.

As mentioned above, designers are unable to effectively determine which latches are non-overlapping, especially when the overlapping latches are often from diverse areas of the design and the designer may be unable or not understand the uses of another designer's latch implementation. The invention provides an automated approach of determining which latches can be shared across a design. As such, this invention provides a new method of reducing the number of latches within the design without impacting the functionality of the design.

Though simulation, the invention identifies the latches that are mutually exclusive functionally and combines them at the PD (physical design) backend. The exact latches to be combined is not known until PD and is not determined at architecture definition or even front end processing. Therefore, the invention is very suitable for control logic.

The latches are created manually during logic design by the designer for each function. Often teams of logic designers work together on the macros and tens of thousands of latches are being coded by a multitude of designers. Each design team is focused on their scope of work and cannot be fully aware of each other's use of latches. In addition, a single designer can be responsible for 50 to 100 thousand lines of code, with often three to four thousand latches. Due to the nature of the design, the designer works on one portion of the design at a time and does not have time to fully determine which latches can be shared with others within his scope of design. Determining latches that can be shared outside the scope of a designer is not truly feasible. In addition, the latches that can be shared are for boolean non-related function and a human is unable to detect or realize whether or not latches have an overlapping time.

Though the use of simulation scoreboarding, the invention builds a database that determines (over the full simulation suite) the register usage over time. Essentially, for each time increment, a list of latches that require transition is maintained in the database. Once the simulation completes, a post processing program is run that updates a master list of registers and keeps a list per register of possible candidates. To simplify the process, in one embodiment, only latches within the same clock domain may be combined. However, the invention is equally applicable to multiple clock domains.

Once the design is frozen and entering the physical design phase, the grouping of latches is based upon two additional criteria. First is the floor plan proximity of the function and the second is the checking of sufficient slack to support the automatic combination of functional latches. After identifying which latches are to be combined, an ECO (engineering change option) is applied to the gate level netlist to perform this compression.

The recombination is not limited to just two latches, the invention creates a linked list time domain structure such that more than two latches can be combined into a single latch, as long as the sequential execution of each function is non-overlapping.

Once the design has been modified, several techniques exists to verify that the altered design matches the original design. On the first order, the same architecture test-cases can be rerun to ensure that the results are the same. Some modifications may be needed if the verification calls out explicit registers that have been merged, then the new structure elements (the equilivance stage), must be referenced instead. Another test method is to use some of the standard formal verification tools. These tools will verify a boolean equivalence and may be the best tool to ensure that the designs are exactly equivalent.

Figure 1B:
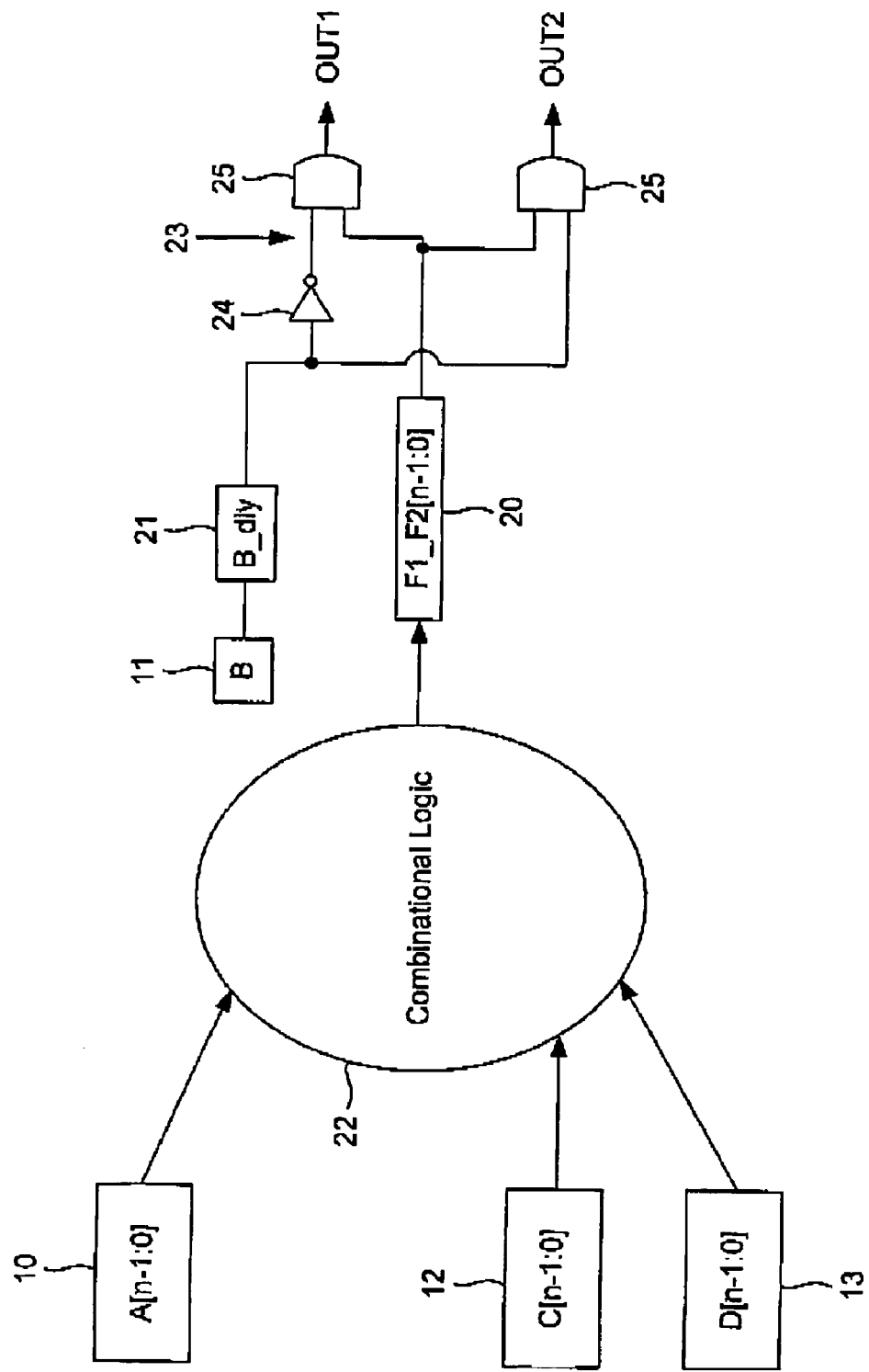
FIG. 1B is a schematic diagram of a initial physical design after elimination of redundant latches.

FIGS. 1A–1B illustrate the operation of the invention schematically. More specifically, in FIG. 1A registers 10–13 utilize various combinational logic units 14, 15, which in turn utilize latches 16, 17. Note that register B utilizes both sets of combinational logic 14, 15. However, because register B can only utilize one of the sets of combinational logic 14, 15 at a time, latches 16 and 17 will never be used simultaneously. Therefore, assuming that there are no issues relating to logical function, clock domain, physical proximity, and assuming that there is adequate timing slack, latches 14 and 15 can be replaced with a single latch 20, as shown in FIG. 1B. In the compressed example shown in FIG. 1B, the combinational logic units 14, 15 act as a single unit and is therefore shown as a single unit 22. In addition, register B 11 is moved to a position downstream from the compressed latch 20 such that when register B would have previously utilized combinational logic 14, latch 20 acts like previous latch 16; and when register B would have previously utilize combinational logic 15, latch 20 acts like previous latch 17. Therefore, the replacement of the multiple latches 16, 17 with a single latch 20 is transparent to those devices outside this circuit because the circuit still maintains two separate outputs that would output the same information in an identical manner.

The selection logic 23 locks non-active output(s) to a known logical state when a corresponding output (e.g., the other output(s) in a pair (or set) of outputs) is active. Essentially, the inverter 24 makes the output from the two AND devices 25 mutually exclusive. Similar arrangements with other logical devices to achieve the same result could be substituted here as would be understood by one ordinarily skilled in the art. The selection logic has more outputs than latches and preferably includes outputs equal in number to the number of latches in the initial physical design to allow the delay device 21 and selection logic 23 to provide a similar output as would have been seen with the non-compressed examples shown in FIG. 1A. While only two outputs are illustrated in FIG. 1B, as would be understood by one ordinarily skilled in the art in light of this disclosure, the selection logic 23 could (and would most likely) provide more than two outputs. Further, the inverter 24 combined with AND devices 25 (within the selection logic 23) permit one control signal to control a series of outputs similarly. Therefore, a single control signal could be used to control multiple sets of compressed latches within a hierarchical design.

Figure 2:
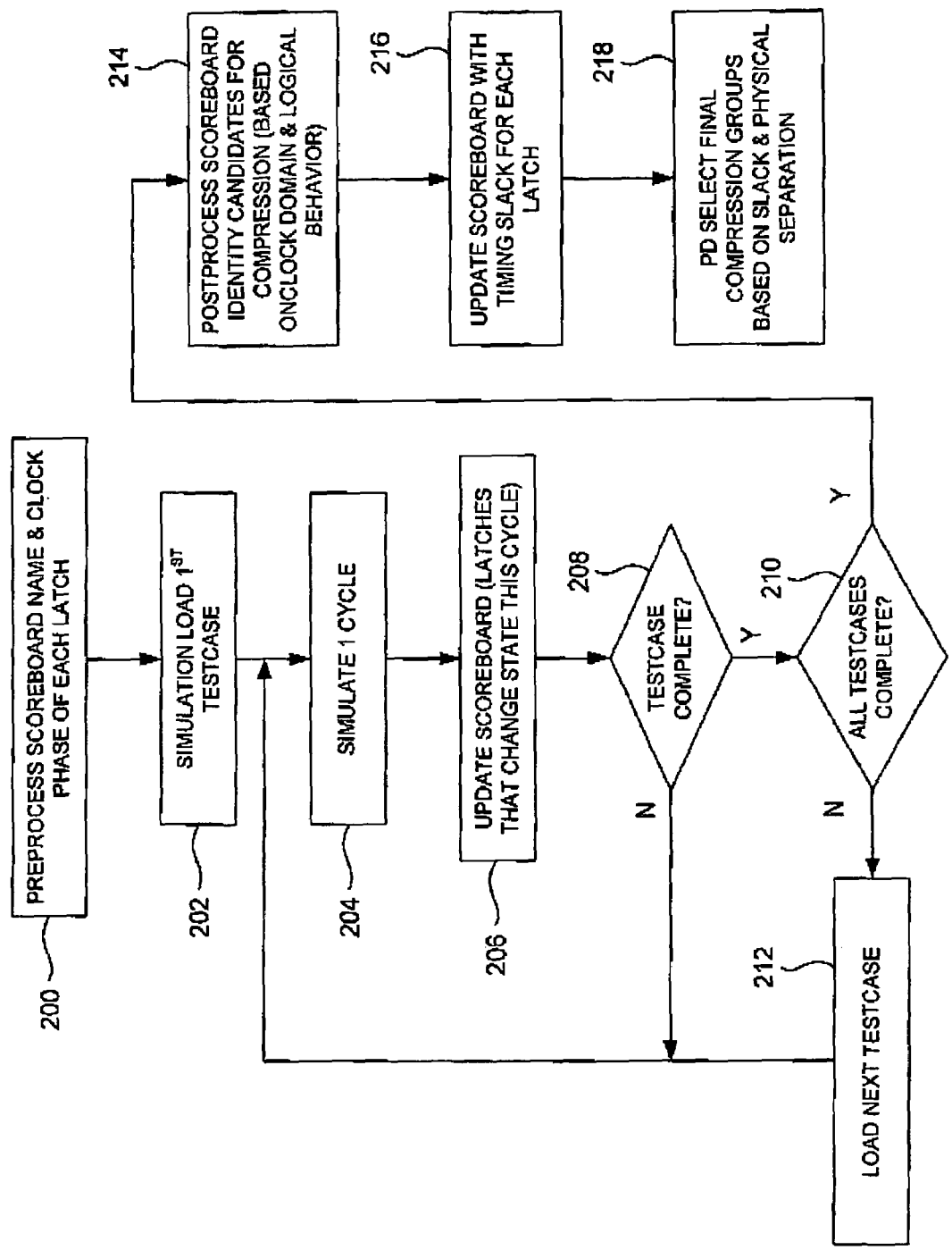
FIG. 2 is a flow diagram illustrating a preferred method of the invention.

FIG. 2 shows the processing of the invention in flowchart form. In item 200, the invention pre-processes the scoreboard within the database by recording the name and clock phase of each latch. In item 202, the invention performs the above-mentioned simulation (by loading a first test case). Item 204 represents the simulation of one clock cycle and in item 206, the invention updates the scoreboard in the database to record which latches changed state in that cycle. The decision block 208 allows the invention to loop back through items 204 and 206 until the test case is complete. Similarly, item 210 loops back through the next test case until all test cases have been completed.

Once all test cases are completed, the invention performs a "post-process" on the scoreboard in the database which identifies latches that are candidates for compression based on clock domain and logical behavior. In item 216, the invention updates the scoreboard regarding the timing slack for each latch. Then, in the physical development stage shown in item, 218 the invention performs the selection of the final compression groups based on slack, physical separation, etc.

Therefore, as shown above, the invention provides a method of designing an integrated circuit having latches. The invention first prepares a logical design of logic devices and latches and then creates a physical design by positioning the logic devices and the latches within the integrated circuit based on the logical design. During the process of creating the physical design the invention eliminates redundant latches by combining latches which do not transition during the same clock cycle, do not relate to the same logical function, are in the same clock domain, and are within a given physical proximity of each other.

The invention determines whether latches transition during the same clock cycle by running a simulation of an initial physical design and recording the latches that transition during each clock cycle. The invention also determines whether an adequate timing slack exists between transitions of latches that do not transition during the same clock cycle. The foregoing process of eliminating redundant latches comprises replacing at least two latches with a single latch. The process of eliminating redundant latches produces a revised physical design, and the invention tests the revised physical design to determine whether the revised physical design performs as expected (e.g., performs as the non-compressed design would have performed).

While the invention has been described in terms of preferred embodiments, those skilled in the art will recognize that the invention can be practiced with modification within the spirit and scope of the appended claims.

The invention claimed is:

1. A method of designing an integrated circuit having latches, said method comprising:
   preparing a logical design of logic devices and latches; and
   creating a physical design by positioning said logic devices and said latches within said integrated circuit based on said logical design,
   wherein said creating of said physical design further comprises:
      eliminating redundant latches, wherein redundant latches comprise latches which do not transition during the same clock cycle; and
      adding selecting logic to make outouts corresponding to eliminated redundant latches mutually exclusive to outputs corresponding to remaining latches.

2. The method in claim 1, further comprising determining whether latches transition during the same clock cycle by running a simulation of an initial physical design and recording the latches that transition during each clock cycle.

3. The method in claim 2, wherein said process of determining whether latches transition during the same clock cycle further comprises determining whether an adequate timing slack exists between transitions of latches that do not transition during the same clock cycle.

4. The method in claim 1, wherein said process of eliminating redundant latches comprises replacing at least two redundant latches with a single latch.

5. The method in claim 1, wherein said process of eliminating redundant latches produces a revised physical design, and said process further comprises testing said revised physical design to determine whether said revised physical design performs as expected.

6. The method in claim 1, further comprising determining whether said latches relate to the same logical function by recording which latches are associated with each logical function in said logical design.

7. The method in claim 1, further comprising determining whether said latches are in the same clock domain by recording which latches are associated with each clock domain in said logical design.

8. A method of designing an integrated circuit having latches, said method comprising:

preparing a logical design of logic devices and latches;

creating an initial physical design by positioning said logic devices and said latches within said integrated circuit based on said logical design;

preparing a database of transition times for said latches by running a simulation of an initial physical design and recording the clock cycle in which each latch transitions;

altering said initial physical design to eliminate redundant latches which do not transition during the same clock cycle; and adding selecting logic to make outputs corresponding to eliminated redundant latches mutually exclusive to outputs corresponding to remaining latches.

9. The method in claim 8, wherein said altering of said initial physical design further considers whether latches relate to the same logical function, whether latches are in the same clock domain, and whether latches are within a given physical proximity of each other.

10. The method in claim 8, wherein said altering of said initial physical design further considers whether an adequate timing slack exists between transitions of latches that do not transition during the same clock cycle.

11. The method in claim 8, wherein said altering of said initial physical design to eliminate redundant latches comprises replacing at least two redundant latches with a single latch.

12. The method in claim 8, wherein said altering of said initial physical design to eliminate redundant latches produces a revised physical design, and said process further comprises testing said revised physical design to determine whether said revised physical design performs as expected.

13. The method in claim 8, further comprising determining whether said latches relate to the same logical function by recording, in said database, which latches are associated with each logical function in said logical design.

14. A method of designing an integrated circuit having latches, said method comprising:

preparing a logical design of logic devices and latches;

creating an initial physical design by positioning said logic devices and said latches within said integrated circuit based an said logical design;

preparing a database of transition times for said latches by running a simulation of an initial physical design and recording the clock cycle in which each latch transitions;

altering said initial physical design to eliminate redundant latches which do not transition during the same clock cycle; and adding selection logic connected to said latches, wherein said selection logic locks a non-active output to a known logical state when another output is active.

15. A method of designing an integrated circuit having latches, said method comprising:

preparing a logical design of logic devices and latches;

creating an initial physical design by positioning said logic devices and said latches within said integrated circuit based on said logical design;

preparing a database of transition times for said latches by running a simulation of an initial physical design and recording the clock cycle in which each latch transitions;

altering said initial physical design to eliminate redundant latches which do not transition during the same clock cycle, do not relate to the same logical function, are in the same clock domain, and are within a given physical proximity of each other; and adding selecting logic to make outputs corresponding to eliminated redundant latches mutually exclusive to outputs corresponding to remaining latches.

16. The method in claim 15, wherein said altering of said initial physical design further considers whether an adequate timing slack exists between transitions of latches that do not transition during the same clock cycle.

17. The method in claim 15, wherein said altering of said initial physical design to eliminate redundant latches comprises replacing at least two redundant latches with a single latch.

18. The method in claim 15, wherein said altering of said initial physical design to eliminate redundant latches produces a revised physical design, and said process further comprises testing said revised physical design to determine whether said revised physical design performs as expected.

19. The method in claim 15, further comprising determining whether said latches relate to the same logical function by recording, in said database, which latches are associated with each logical function in said logical design.

20. The method in claim 15, further comprising determining whether said latches are in the same clock domain by recording, in said database, which latches are associated with each clock domain in said logical design.

21. A method of designing an integrated circuit having latches, said method comprising:

preparing a logical design of logic devices and latches;

creating an initial physical design by positioning said logic devices and said latches within said integrated circuit based on said logical design;

preparing a database of transition times for said latches by running a simulation of an initial physical design and recording the clock cycle in which each latch transitions;

determining whether said latches relate to the same logical function by recording, in said database, which latches are associated with each logical function in said logical design;

determining whether said latches are in the same clock domain by recording, in said database, which latches are associated with each clock domain in said logical design;

altering said initial physical design to eliminate redundant latches which do not transition during the same clock cycle, do not relate to the same logical function, are in the same clock domain, and are within a given physical proximity of each other, wherein said process of altering said initial physical design to eliminate redundant latches produces a revised physical design, and said process further comprises testing said revised physical design to determine whether said revised physical design performs as expected; and adding selecting logic to make outputs corresponding to eliminated redundant latches mutually exclusive to outputs corresponding to remaining latches.

22. The method in claim 21, wherein said altering of said initial physical design further considers whether an adequate timing slack exists between transitions of latches that do not transition during the same clock cycle.

23. The method in claim 21, wherein said altering of said initial physical design to eliminate redundant latches comprises replacing at least two redundant latches with a single latch.

24. A method of designing an integrated circuit having latches, said method comprising:
preparing a logical design of logic devices and latches;
creating an initial physical design by positioning said logic devices and said latches within said integrated circuit based on said logical design;
eliminating redundant latches from said initial physical design to create a revised physical design; and
adding selection logic connected to said latches in said revised physical design, wherein said selection logic includes outputs equal in number to the number of latches in said initial physical design and said selection logic locks a non-active output to a known logical state when a corresponding output is active.

25. The method in claim 24, wherein said adding of said selection logic comprises adding inverters and logical AND devices connected to said latches to make said outputs mutually exclusive.

26. The method in claim 24, wherein said adding of said selection logic permits one control signal to control a series of outputs similarly.

27. The method in claim 24, wherein redundant latches comprise latches which do not transition during the same clock cycle, do not relate to the same logical function, are in the same clock domain, and are within a given physical proximity of each other.

28. The method in claim 27, further comprising determining whether latches transition during the same clock cycle by running a simulation of an initial physical design and recording the latches that transition during each clock cycle.

29. The method in claim 28, wherein said process of determining whether latches transition during the same clock cycle further comprises determining whether an adequate timing slack exists between transitions of latches that do not transition during the same clock cycle.

30. The method in claim 24, wherein said process of eliminating redundant latches comprises replacing at least two redundant latches with a single latch.

31. The method in claim 24, further comprising testing said revised physical design to determine whether said revised physical design performs as expected.

32. The method in claim 27, further comprising determining whether said latches relate to the same logical function by recording which latches are associated with each logical function in said logical design.

33. The method in claim 27, further comprising determining whether said latches are in the same clock domain by recording which latches are associated with each clock domain in said logical design.

34. A program storage device readable by machine, tangibly embodying a program of instructions executable by the machine to perform a method of designing an integrated circuit having latches, said method comprising:
preparing a logical design of logic devices and latches;
creating an initial physical design by positioning said logic devices and said latches within said integrated circuit based on said logical design;
preparing a database of transition times for said latches by running a simulation of an initial physical design and recording the clock cycle in which each latch transitions;
altering said initial physical design to eliminate redundant latches which do not transition during the same clock cycle; and
adding selecting logic to make outputs corresponding to eliminated redundant latches mutually exclusive to outputs corresponding to remaining latches.

35. The program storage device in claim 34, wherein said altering of said initial physical design further considers whether latches relate to the same logical function, whether latches are in the same clock domain, and whether latches are within a given physical proximity of each other.

36. The program storage device in claim 34, wherein said altering of said initial physical design further considers whether an adequate timing slack exists between transitions of latches that do not transition during the same clock cycle.

37. The program storage device in claim 34, wherein said altering of said initial physical design to eliminate redundant latches comprises replacing at least two redundant latches with a single latch.

38. The program storage device in claim 34, wherein said altering of said initial physical design to eliminate redundant latches produces a revised physical design, and said process further comprises testing said revised physical design to determine whether said revised physical design performs as expected.

39. The program storage device in claim 34, wherein said method further comprises determining whether said latches relate to the same logical function by recording, in said database, which latches are associated with each logical function in said logical design.

40. The program storage device in claim 34, wherein said method further comprises determining whether said latches are in the same clock domain by recording, in said database, which latches are associated with each clock domain in said logical design.

* * * * *